(12) United States Patent
Sakuma et al.

(10) Patent No.: US 7,402,943 B2
(45) Date of Patent: Jul. 22, 2008

(54) OXYNITRIDE PHOSPHOR AND A LIGHT EMITTING DEVICE

(75) Inventors: Ken Sakuma, Sakura (JP); Naoto Hirosaki, Tsukuba (JP)

(73) Assignees: Fujikura Ltd., Tokyo (JP); National Institute for Materials Science, Ibaraki (JP)

( * ) Notice: Subject to any disclaimer, the term of this patent is extended or adjusted under 35 U.S.C. 154(b) by 0 days.

(21) Appl. No.: 11/085,046

(22) Filed: Mar. 22, 2005

(65) Prior Publication Data

US 2005/0285506 A1   Dec. 29, 2005

(30) Foreign Application Priority Data

Mar. 22, 2004   (JP)   ............................. P2004-083419

(51) Int. Cl.
*H01J 63/04*   (2006.01)
(52) U.S. Cl. ............................. 313/503; 252/301.4 R; 252/301.4 P
(58) Field of Classification Search ................. 313/503; 252/301.4 F, 301.4 R, 301.4 P; 501/98.2
See application file for complete search history.

(56) References Cited

U.S. PATENT DOCUMENTS

| | | | |
|---|---|---|---|
| 6,632,379 B2 * | 10/2003 | Mitomo et al. | 252/301.4 R |
| 6,657,379 B2 * | 12/2003 | Ellens et al. | 313/503 |
| 7,258,818 B2 * | 8/2007 | Sakata et al. | 252/301.4 F |
| 2003/0030038 A1 * | 2/2003 | Mitomo et al. | 252/500 |
| 2003/0030368 A1 * | 2/2003 | Ellens et al. | 313/503 |
| 2003/0168643 A1 * | 9/2003 | Mitomo et al. | 252/500 |
| 2004/0155225 A1 * | 8/2004 | Yamada et al. | 252/301.4 R |
| 2005/0194604 A1 * | 9/2005 | Sakuma et al. | 257/98 |
| 2006/0061263 A1 * | 3/2006 | Sakuma et al. | 313/503 |

FOREIGN PATENT DOCUMENTS

| | | |
|---|---|---|
| JP | 2002-363554 A | 12/2002 |
| JP | 2003-124527 A | 4/2003 |
| JP | 2003-336059 A | 11/2003 |
| JP | 2004-067837 A | 3/2004 |
| JP | 2004-186278 A | 7/2004 |
| JP | 2004-238505 A | 8/2004 |

OTHER PUBLICATIONS

J.W.H van Krevel, On new rare-earth doped M-Si-Al-O-N material, Jan. 2000, CIP-Data Library, p. 154-155.*

* cited by examiner

*Primary Examiner*—Toan Ton
*Assistant Examiner*—Hana A Sanei
(74) *Attorney, Agent, or Firm*—Sughrue Mion, PLLC (57) ABSTRACT

A preferred embodiment according to the present invention provides in one preferred mode an oxynitride phosphor especially suitable for a light emitting device such as but not limited to a white light emitting diode lamp and also such a light emitting device. The oxynitride phosphor in the embodiment is represented by a general formula $Ca_x(Si,Al)_{12}(O,N)_{16}:Eu^{2+}_y$, wherein a Ca composition of x is in a range of from 0.75 to 1.0 and a Eu composition of y is in a range of from 0.04 to 0.25, and wherein a main phase thereof has substantially an alpha SiAlON crystal structure.

3 Claims, 14 Drawing Sheets

FIG. 1

| SAMPLE | DESIGNED COMPOSITION | | MIXTURE COMPOSITION (UNIT: PERCENT BY MASS) | | | |
|---|---|---|---|---|---|---|
| | x(Ca) | y(Eu) | Si3N4 | AlN | CaCO3 | Eu2O3 |
| #1 | 0.875 | 0.02 | 68.20 | 17.48 | 13.76 | 0.55 |
| #2 | 0.875 | 0.04 | 67.23 | 17.98 | 13.69 | 1.10 |
| #3 | 0.875 | 0.0833 | 65.14 | 19.03 | 13.56 | 2.27 |
| #4 | 0.875 | 0.25 | 57.49 | 22.91 | 13.05 | 6.55 |
| #5 | 0.875 | 0.5 | 47.02 | 28.20 | 12.36 | 12.42 |
| #6 | 0.75 | 0.02 | 72.14 | 15.32 | 11.99 | 0.56 |
| #7 | 0.75 | 0.04 | 71.11 | 15.83 | 11.94 | 1.12 |
| #8 | 0.75 | 0.0833 | 68.96 | 16.92 | 11.81 | 2.30 |
| #9 | 0.75 | 0.25 | 61.04 | 20.94 | 11.36 | 6.66 |
| #10 | 0.75 | 0.5 | 50.23 | 26.42 | 10.75 | 12.60 |
| #11 | 1 | 0.02 | 64.41 | 19.58 | 15.47 | 0.54 |
| #12 | 1 | 0.04 | 63.46 | 20.05 | 15.41 | 1.08 |
| #13 | 1 | 0.0833 | 61.44 | 21.08 | 15.25 | 2.23 |
| #14 | 1 | 0.25 | 54.04 | 24.82 | 14.69 | 6.45 |
| #15 | 1 | 0.5 | 43.90 | 29.93 | 13.92 | 12.24 |
| #16 | 1.25 | 0.02 | 57.16 | 23.58 | 18.74 | 0.52 |
| #17 | 1.25 | 0.04 | 56.27 | 24.02 | 18.66 | 1.05 |
| #18 | 1.25 | 0.0833 | 54.38 | 24.97 | 18.48 | 2.17 |
| #19 | 1.25 | 0.25 | 47.46 | 28.46 | 17.81 | 6.27 |
| #20 | 1.25 | 0.5 | 37.93 | 33.26 | 16.92 | 11.89 |
| #21 | 0.5 | 0.04 | 79.31 | 11.32 | 8.22 | 1.16 |
| #22 | 0.5 | 0.0833 | 76.98 | 12.50 | 8.14 | 2.38 |
| #23 | 0.5 | 0.25 | 68.49 | 16.81 | 7.82 | 6.88 |

FIG. 2

| SAMPLE | EMISSION PEAK WAVELENGTH (nm) | EXCITATION PEAK WAVELENGTH (nm) | FLUORESCENT INTENSITY (a.u.) |
|---|---|---|---|
| #1 | 571 | 392 | 2570 |
| #2 | 570 | 400 | 2897 |
| #3 | 582 | 410 | 3981 |
| #4 | 586 | 435 | 2839 |
| #5 | 587 | 449 | 2345 |
| #6 | 573 | 401 | 1926 |
| #7 | 574 | 396 | 2892 |
| #8 | 582 | 404 | 2919 |
| #9 | 586 | 440 | 2720 |
| #10 | 584 | 450 | 2078 |
| #11 | 570 | 394 | 2109 |
| #12 | 577 | 397 | 2948 |
| #13 | 582 | 406 | 3140 |
| #14 | 591 | 438 | 2442 |
| #15 | 592 | 449 | 2051 |
| #16 | 571 | 400 | 1639 |
| #17 | 578 | 407 | 1881 |
| #18 | 579 | 410 | 2190 |
| #19 | 595 | 446 | 1736 |
| #20 | 596 | 449 | 1747 |
| #21 | 574 | 400 | 2362 |
| #22 | 582 | 404 | 2889 |
| #23 | 582 | 431 | 2112 |

| SAMPLE | EXCITATION | | |
|---|---|---|---|
| | at 450nm | at 460nm | at 470nm |
| #2 | 577.7 | 578.3 | 579.2 |
| #3 | 580.5 | 580.9 | 581.5 |
| #4 | 581.9 | 582.3 | 582.8 |
| #7 | 578.1 | 578.7 | 579.4 |
| #8 | 580.2 | 580.6 | 581.2 |
| #9 | 581.0 | 581.4 | 582.0 |
| #12 | 577.8 | 578.4 | 579.2 |
| #13 | 580.2 | 580.6 | 581.2 |
| #14 | 583.0 | 583.3 | 583.7 |

| SAMPLE | DESIGNED COMPOSITION | | MIXTURE COMPOSITION (UNIT: PERCENT BY MASS) | | | |
|---|---|---|---|---|---|---|
| | x(Ca) | y(Eu) | $\alpha$-$Si_3N_4$ | AlN | $CaCO_3$ | $Eu_2O_3$ |
| #31 | 0.875 | 0.02 | 68.20 | 17.48 | 13.76 | 0.55 |
| #32 | 0.875 | 0.04 | 67.23 | 17.98 | 13.69 | 1.10 |
| #33 | 0.875 | 0.0833 | 65.14 | 19.03 | 13.56 | 2.27 |
| #34 | 0.875 | 0.25 | 57.49 | 22.91 | 13.05 | 6.55 |
| #35 | 0.875 | 0.5 | 47.02 | 28.20 | 12.36 | 12.42 |
| #36 | 0.75 | 0.02 | 72.14 | 15.32 | 11.99 | 0.56 |
| #37 | 0.75 | 0.04 | 71.11 | 15.83 | 11.94 | 1.12 |
| #38 | 0.75 | 0.0833 | 68.96 | 16.92 | 11.81 | 2.30 |
| #39 | 0.75 | 0.25 | 61.04 | 20.94 | 11.36 | 6.66 |
| #40 | 0.75 | 0.5 | 50.23 | 26.42 | 10.75 | 12.60 |
| #41 | 1 | 0.02 | 64.41 | 19.58 | 15.47 | 0.54 |
| #42 | 1 | 0.04 | 63.46 | 20.05 | 15.41 | 1.08 |
| #43 | 1 | 0.0833 | 61.44 | 21.08 | 15.25 | 2.23 |
| #44 | 1 | 0.25 | 54.04 | 24.82 | 14.69 | 6.45 |
| #45 | 1 | 0.5 | 43.90 | 29.93 | 13.92 | 12.24 |
| #46 | 1.25 | 0.02 | 57.16 | 23.58 | 18.74 | 0.52 |
| #47 | 1.25 | 0.04 | 56.27 | 24.02 | 18.66 | 1.05 |
| #48 | 1.25 | 0.0833 | 54.38 | 24.97 | 18.48 | 2.17 |
| #49 | 1.25 | 0.25 | 47.46 | 28.46 | 17.81 | 6.27 |
| #50 | 1.25 | 0.5 | 37.93 | 33.26 | 16.92 | 11.89 |
| #51 | 0.5 | 0.04 | 79.31 | 11.32 | 8.22 | 1.16 |
| #52 | 0.5 | 0.0833 | 76.98 | 12.50 | 8.14 | 2.38 |
| #53 | 0.5 | 0.25 | 68.49 | 16.81 | 7.82 | 6.88 |
| #54 | 0.5 | 0.5 | 56.94 | 22.69 | 7.39 | 12.98 |
| #55 | 0.25 | 0.04 | 88.06 | 6.49 | 4.26 | 1.20 |
| #56 | 0.25 | 0.0833 | 85.58 | 7.75 | 4.20 | 2.46 |
| #57 | 0.25 | 0.25 | 76.46 | 12.41 | 4.03 | 7.10 |
| #58 | 0.25 | 0.5 | 64.08 | 18.72 | 3.81 | 13.39 |

FIG. 12

| SAMPLE | EXCITATION at 450nm | | EXCITATION at 405nm | |
|---|---|---|---|---|
| | FLUORESCENT INTENSITY (a.u.) | EMISSION PEAK WAVELENGTH (nm) | FLUORESCENT INTENSITY (a.u.) | EMISSION PEAK WAVELENGTH (nm) |
| #31 | 6074 | 577.4 | 5978 | 574.4 |
| #32 | 7192 | 583.6 | 6774 | 577.0 |
| #33 | 7324 | 585.0 | 6882 | 581.6 |
| #34 | 5279 | 591.6 | 4291 | 591.0 |
| #35 | 4513 | 590.6 | 3288 | 585.0 |
| #36 | 4953 | 577.4 | 4926 | 571.4 |
| #37 | 7250 | 578.2 | 6728 | 573.8 |
| #38 | 7768 | 584.8 | 7098 | 581.2 |
| #39 | 5143 | 591.6 | 4608 | 591.6 |
| #40 | 4203 | 590.6 | 3354 | 584.6 |
| #41 | 6661 | 578.2 | 6471 | 574.8 |
| #42 | 7628 | 580.6 | 7241 | 577.0 |
| #43 | 7487 | 585.8 | 6787 | 584.4 |
| #44 | 5060 | 593.6 | 3987 | 591.0 |
| #45 | 3947 | 591.8 | 2837 | 588.6 |
| #46 | 5414 | 580.4 | 5210 | 574.2 |
| #47 | 7171 | 584.4 | 6269 | 580.4 |
| #48 | 6753 | 585.0 | 5563 | 580.4 |
| #49 | 4979 | 594.8 | 3581 | 592.0 |
| #50 | 3539 | 594.0 | 2712 | 591.6 |
| #51 | 4426 | 578.0 | 4536 | 574.4 |
| #52 | 5798 | 581.0 | 5568 | 577.0 |
| #53 | 4510 | 588.6 | 4403 | 586.6 |
| #54 | 3966 | 588.0 | 3436 | 584.4 |
| #55 | 2918 | 577.0 | 2993 | 573.6 |
| #56 | 4117 | 584.4 | 4129 | 579.4 |
| #57 | 2681 | 589.8 | 2743 | 586.0 |
| #58 | 2298 | 591.2 | 2185 | 584.8 |

OXYNITRIDE PHOSPHOR AND A LIGHT EMITTING DEVICE

CROSS REFERENCE TO RELATED APPLICATION

This application claims the benefit of priority under 35 U.S.C. § 119 to Japanese Patent Application No. 2004-083419, filed on Mar. 22, 2004, the entire content of which is incorporated by reference herein.

BACKGROUND OF THE INVENTION

1. Field of the Invention

The present invention relates to a europium-activated oxynitride phosphor and a light emitting device using the same.

2. Description of the Related Art

While it is an oxide or sulfide that has since been used as a phosphor, a new phosphor such as a nitride or oxynitride phosphor has attracted a lot of attention and inspired vigorous researches in recent years.

Among the oxynitride phosphors that have been conventionally used, there is a divalent-activated Ca-alpha-SiAlON phosphor (See Japanese Patent Application Laid-open Publication No. 2002-363554, for example). The Ca-alpha-SiAlON phosphor is referred to simply as SiAlON phosphor, when appropriate, hereinafter.

The SiAlON phosphor can be used for example as a wavelength conversion material for a white light emitting diode (white LED) equipped with a blue light emitting diode chip (blue LED) as an excitation light source.

The above white light emitting diode has drawn attention as a next-generation highly efficient lighting apparatus substituting a conventional incandescent or fluorescent lamp and attracted active investigations on such a diode.

Among several types of white light emitting diodes developed to date, the mainstream white light emitting diode is configured to have a blue light emitting diode chip as an excitation light source and a phosphor for converting a wavelength of part of blue light emitted from the blue light emitting diode chip into a different wavelength, thereby emitting white light as a result of color mixture of blue light from the blue light emitting diode chip and the wavelength-converted yellow-light.

In order to improve luminous efficacy and intensity in a light emitting device including such a white light emitting diode of wavelength conversion type, there has to be improved not only the blue light emitting diode chip as an excitation light source but also a conversion efficiency of the phosphor.

While the SiAlON phosphor is suitable as a wavelength conversion material for the white light emitting diode of such a type, a further improvement in luminous efficacy and intensity have been desired.

SUMMARY OF THE INVENTION

A first aspect of the present invention provides an oxynitride phosphor represented by a general formula $Ca_x(Si,Al)_{12}(O,N)_{16}:Eu^{2+}_y$, wherein a Ca composition of x is in a range of from 0.75 to 1.0 and a Eu composition of y is in a range of from 0.04 to 0.25, and wherein a main phase thereof has substantially an alpha-SiAlON crystal structure.

A second aspect of the present invention provides a light emitting device comprising a semiconductor light source element and a wavelength conversion material that converts a wavelength of light emitted from the semiconductor light source element, wherein the wavelength conversion material is represented by a general formula $Ca_x(Si,Al)_{12}(O,N)_{16}:Eu^{2+}_y$, in which a Ca composition of x is in a range of from 0.75 to 1.0 and a Eu composition of y is in a range of from 0.04 to 0.25, and in which a main phase thereof has substantially an alpha SiAlON crystal structure.

A third aspect of the present invention provides a light emitting device according to the second aspect, wherein the semiconductor light source element is a semiconductor light emitting diode element that has a primary emission wavelength in a range of from 400 nm to 480 nm.

DESCRIPTION OF THE PREFERRED EMBODIMENTS

Referring to accompanying drawings, an oxynitride phosphor and a light emitting device according to the present invention will be described in detail.

While a white light emitting diode lamp for general illumination will be described as an embodiment of the light emitting device according to the present invention in the following embodiments, they are intended for purposes of illustration only and are not intended to limit the scope of the invention. Therefore, whereas those skilled in the art can devise various types of alternatives, variations and modifications including each and all elements, all the alternatives, variations and modifications fall within the scope of the present invention.

In addition, in all the drawings used as an aid in describing the following embodiments, identical reference numbers will be used to designate identical or corresponding elements, thereby eliminating unnecessary repetition of description about the identical elements.

Embodiment 1

First of all, a SiAlON phosphor according to the present invention will be described hereinafter.

After tenacious investigations performed to overcome the above-stated disadvantages, the inventors of the present invention have come to find that a divalent-europium activated Ca-alpha-SiAlON having a composition that falls within a certain range has an exceptionally higher luminous intensity than those having the other compositions.

The alpha-SiAlON phosphor is a divalent-europium activated Ca-alpha-SiAlON phosphor having the following chemical formula (1) or (2):

(1)

(2)

Figure 1:
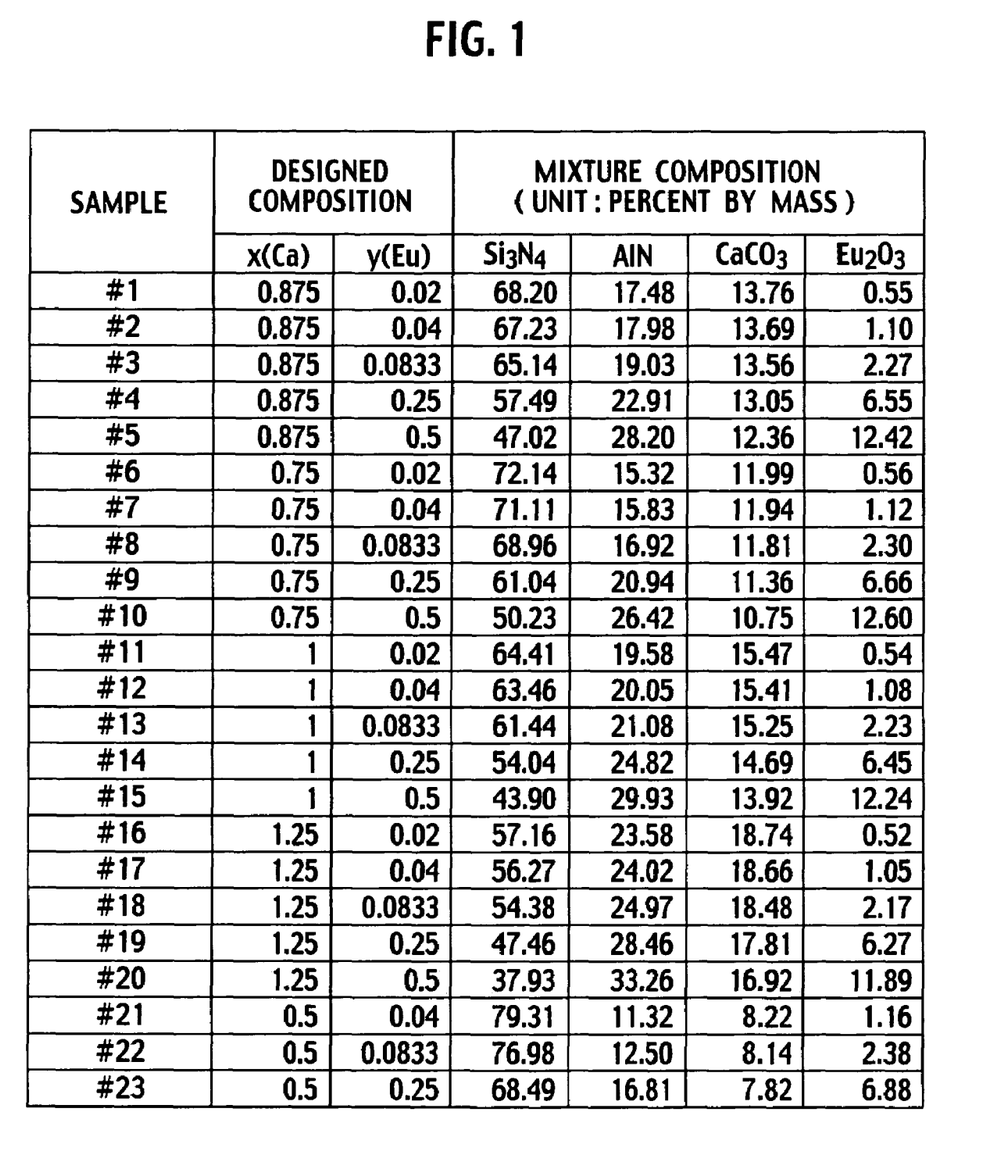
FIG. 1 is a table listing compositions of each Eu-activated Ca-alpha-SiAlON sample.

In an experiment (a first experiment) that has led the inventors to the present invention, twenty-three samples of the phosphors each having a different composition listed in FIG. 1 and many other samples not shown here have been synthesized and optical characteristics thereof have been evaluated.

Next, the composition designing about the above samples is explained.

First, a value of x indicating a Ca composition and a value of y indicating a Eu composition in the formula (1) are determined. These values for each sample 1 to 23 are listed in FIG. 1.

Next, "2x+3y" and "(2x+3y)/2" are defined as m and n, respectively. When designing a composition, Eu is assumed to be trivalent since $Eu_2O_3$ is used as a starting material. However, since Eu can be reduced to be divalent during sintering, the values of m and n are potentially slightly different than designed.

As starting materials in synthesizing each sample above, alpha Silicon Nitride ($Si_3N_4$), Aluminum Nitride (AlN), Calcium Carbonate ($CaCO_3$), and Europium Oxide ($Eu_2O_3$) were used.

Figure 2:
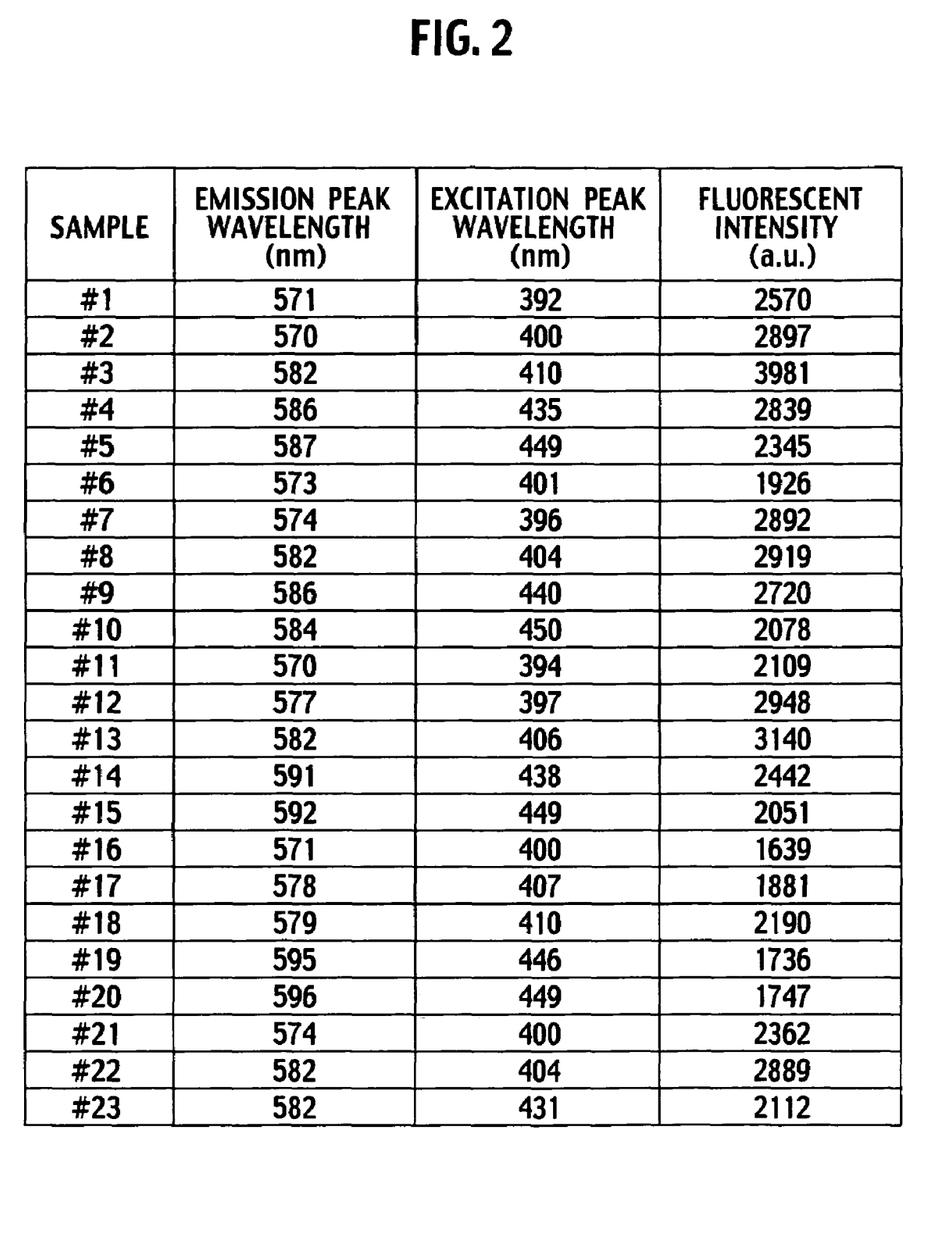
FIG. 2 is a table listing emission and excitation peak wavelengths and emission intensities.

By the way, mass ratios of these starting materials calculated in accordance with the above composition designing are summarized in FIG. 2.

Then, the starting materials in powder form were weighed in accordance with the designed composition stated above and mixed. Prior to mixing, a predetermined amount of n-hexane was added to the weighed materials and then the n-hexane-added materials were well mixed by a planetary ball mill for 2 hours.

The mixed materials were desiccated by a rotary evaporator and then pounded well in a mortar. Next, the pounded materials were charged into a covered container made of Boron Nitride.

Then, the sintering process was carried out for the powder materials in the covered container at a temperature of 1,600 degrees Celsius in a 0.1 MPa Nitrogen atmosphere for about 8 hours.

Since the powder materials were solidified into a mass after the sintering, the mass was then crushed in order to obtain a powder phosphor sample.

The mass after the sintering was easily crushed into powder with an application of only a little force.

After this, the excitation and emission spectra of the 23 powder phosphor samples were measured.

The measurement was carried out by a fluorescence spectrophotometer, which spectral distribution was corrected using Rhodamine B and a standard light source.

Measurement results obtained by the fluorescence spectrophotometer are summarized in FIG. 2. These results show the fact that the SiAlON phosphor has a high luminous intensity in a broad area of its compositions. In addition, when a value of x is in a range of from 0.75 to 1.0 ($0.75 \leq x \leq 1.0$) and a value of y is in a range of from 0.04 to 0.25 ($0.04 \leq y \leq 0.25$), the sample turns out to have excellent characteristics compared with a conventional phosphor. Specifically, the samples having a value of x from 0.75 to 1.0 and a value of y from 0.04 to 0.0833 have been found superior to the others in terms of an emission intensity. More specifically, the sample #3 (x=0.875, y=0.0833) turns out to have extraordinarily excellent characteristics.

Figure 3:
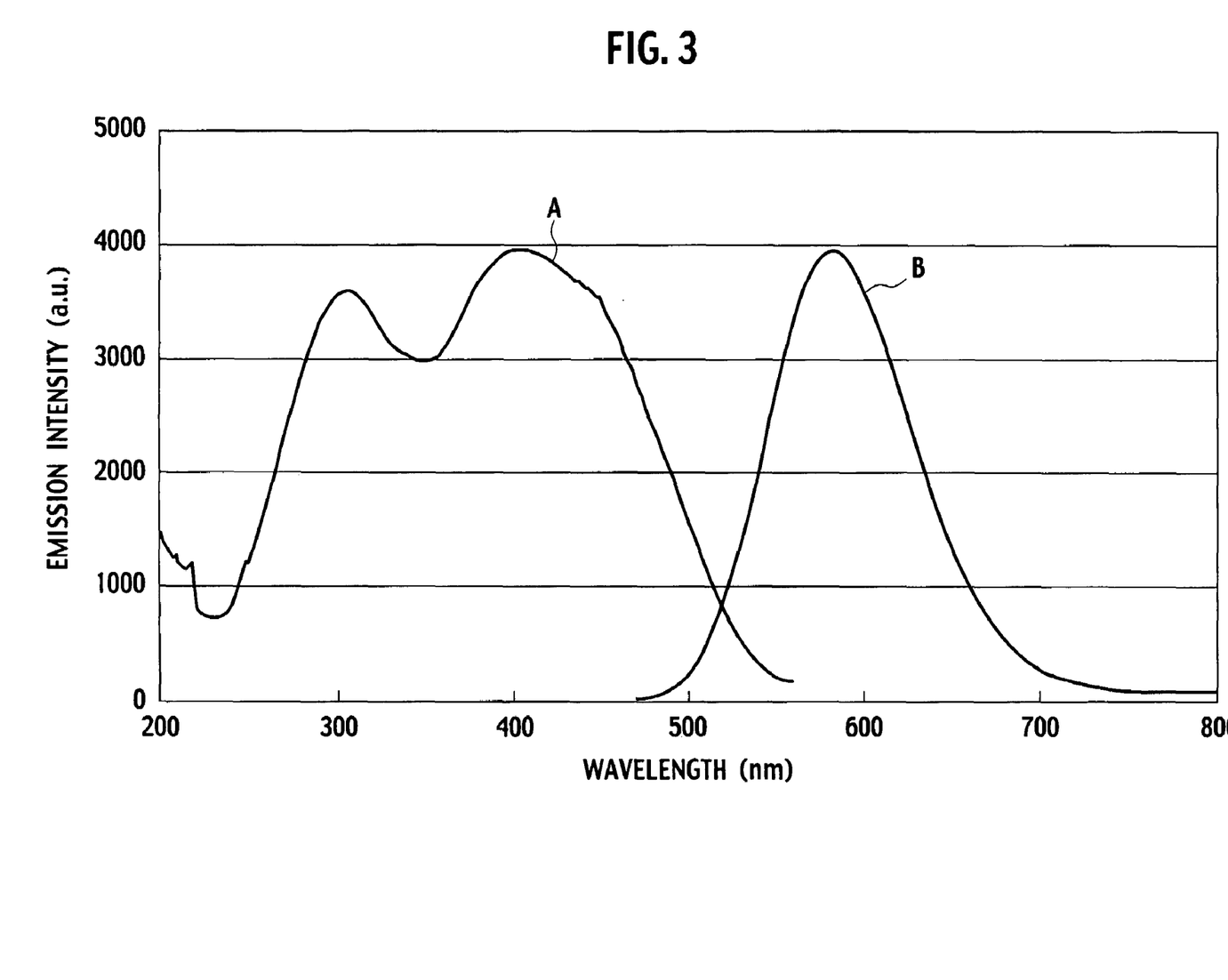
FIG. 3 illustrates excitation and emission spectra of a sample #3.

FIG. 3 illustrates an excitation spectrum (line A) and an emission spectrum (line B) of the sample #3. These spectra have been measured by the fluorescence spectrophotometer. The emission monitoring wavelength when measuring the excitation spectrum was 582 nm and the excitation wavelength when measuring the emission spectrum was 410 nm, as is the case with FIG. 2.

The SiAlON phosphor according to the present invention including the sample #3 is preferable for use in a light emitting device applicable to various light emitting apparatuses or display apparatuses. Specifically, the SiAlON phosphor according to the present invention is suitable as a wavelength conversion material for use in a white light emitting diode lamp for general illumination.

The white light emitting diode lamp is categorized into a near-ultraviolet excitation type and a blue excitation type. The latter will be described hereinafter as an embodiment of the white light emitting diode lamp, the type being now in a mainstream of a white light emitting diode lamp.

The white light emitting diode lamp of blue excitation type has a semiconductor blue light emitting diode chip and a phosphor that is excited by the blue light emitted from the diode chip and emanates yellow light, which is a complementary color of blue.

Figure 4:
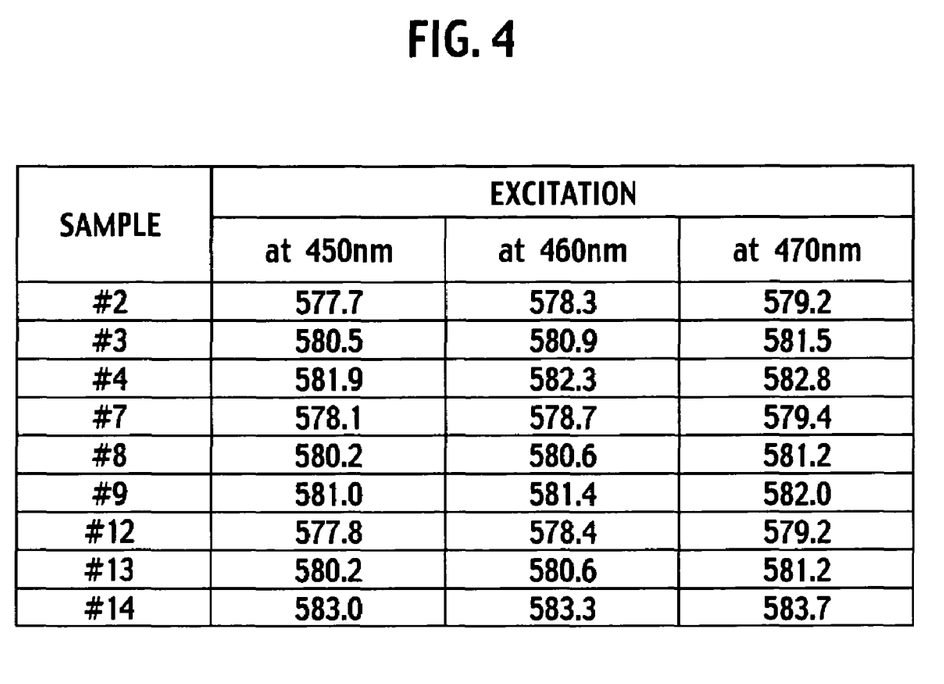
FIG. 4 summarizes dominant wavelengths in emission spectra of the phosphors having a higher luminous intensity among the samples listed in FIG. 2, the emission spectra being measured with excitation wavelengths of 450 nm, 460 nm, and 470 nm, respectively.

FIG. 4 summarizes the dominant wavelengths in emission spectra of the phosphors having a higher luminous intensity among the samples listed in FIG. 2, the emission spectra being measured with excitation wavelengths of 450 nm, 460 nm, and 470 nm, respectively.

Figure 5:
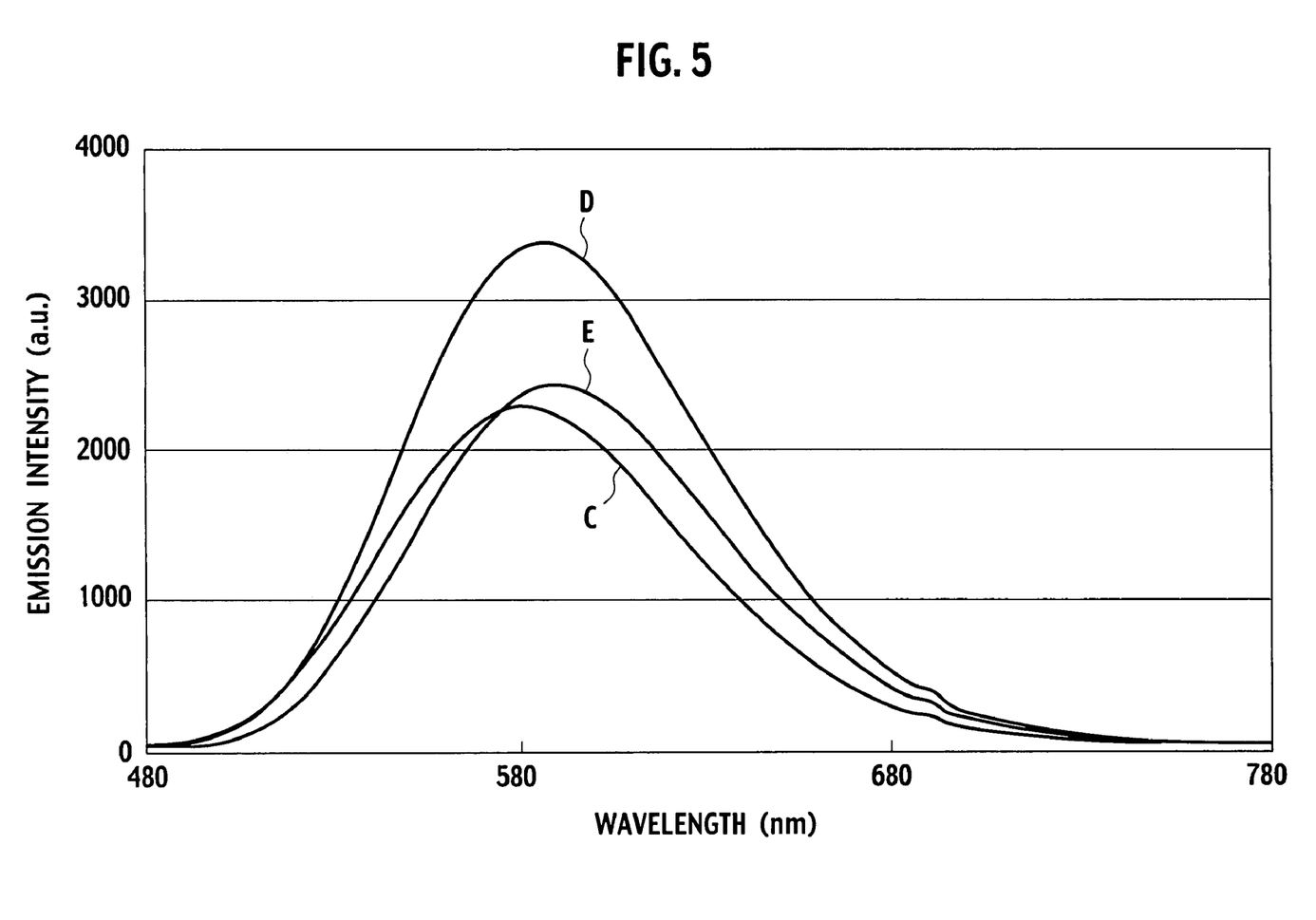
FIG. 5 illustrates emission spectra of some of the samples having a value (Ca composition) of x=0.875, the emission spectra being measured with an excitation wavelength of 460 nm.

In addition, FIG. 5 illustrates emission spectra of some of the samples having a value (Ca composition) of x=0.875, which were measured with the excitation wavelength of 460 nm. In FIG. 5, lines C, D, and E represent the emission spectra of the samples 2, 3, and 4, respectively.

Figure 6:
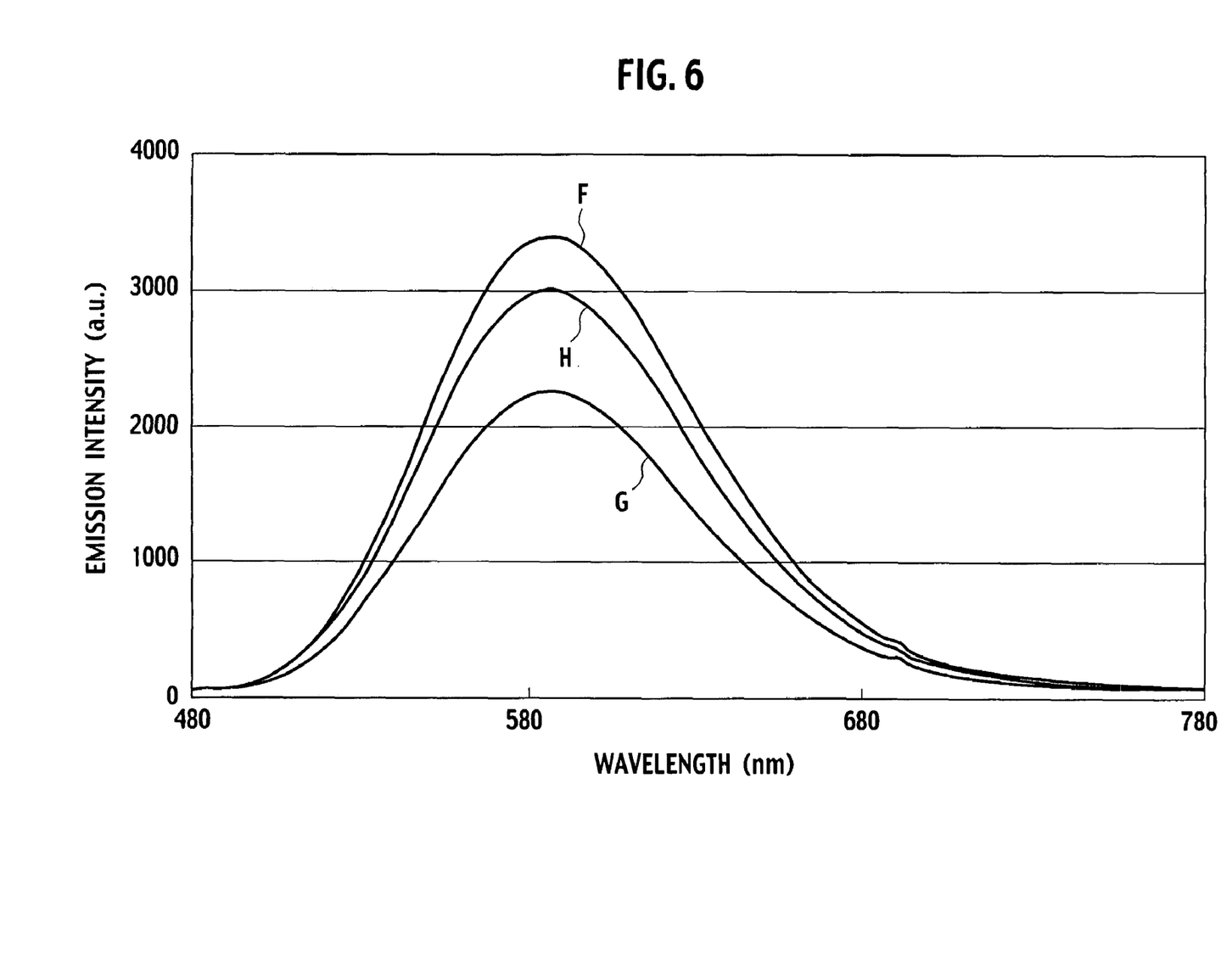
FIG. 6 illustrates emission spectra of some of the samples having a value (Eu composition) of y=0.0833.

Moreover, FIG. 6 illustrates emission spectra of some of the samples having a value (Eu composition) of y=0.0833, which were measured with the excitation wavelength of 460 nm. In FIG. 6, lines F, G, and H represent the emission spectra of the samples 3, 8, and 13, respectively.

From the above results, the SiAlON phosphor according to the present invention is preferable for a blue-excitation-type white light emitting diode (a white light emitting diode lamp for general illumination).

In addition, as apparent from the excitation spectra illustrated in FIG. 3, since the SiAlON phosphor according to the present invention can be efficiently excited by near-ultraviolet light as well, the phosphor is preferably used as a yellow phosphor for a near-ultraviolet-excitation-type white light emitting diode lamp when it is mixed with another phosphors.

Next, a white light emitting diode lamp will be described as an embodiment of a light emitting device comprised of the SiAlON phosphor according to the present invention.

Figure 7:
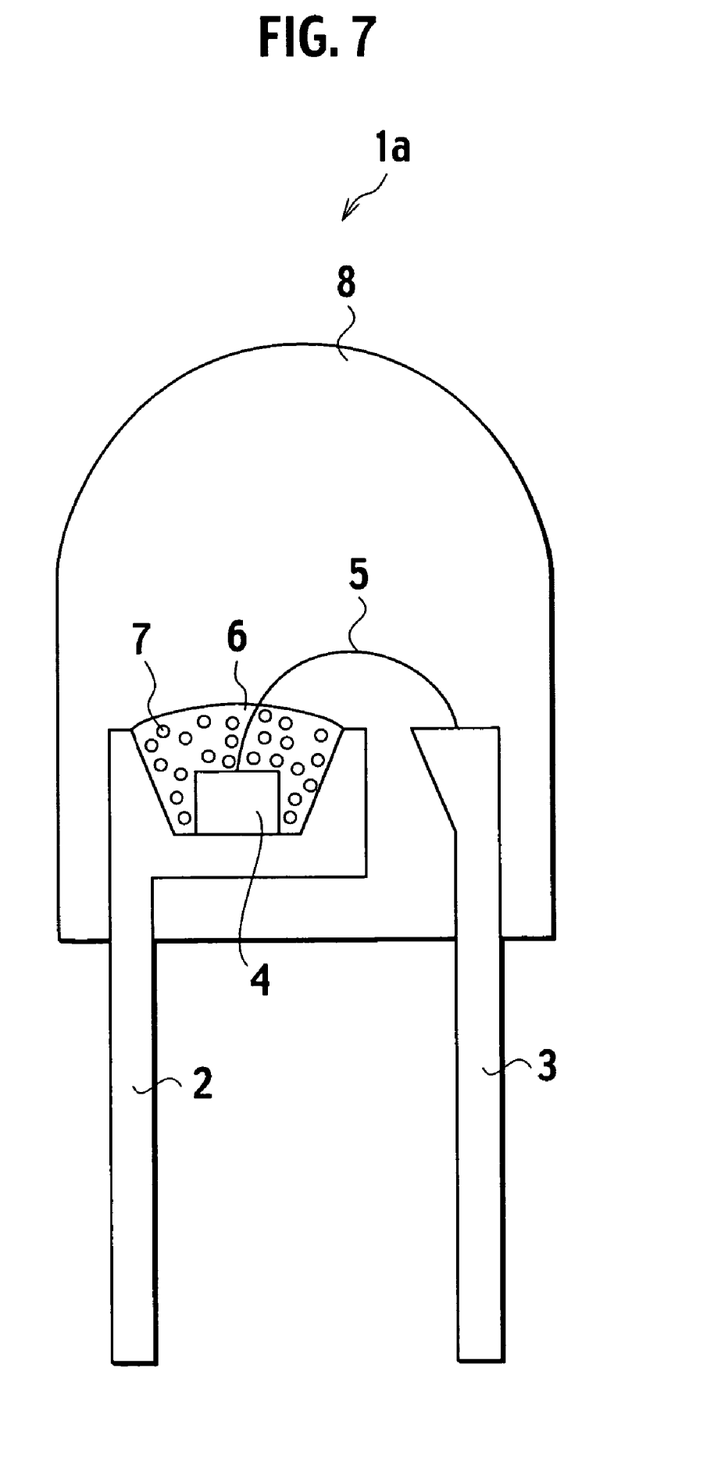
FIG. 7 is a cross-sectional view of a white light emitting diode lamp 1a according to a first embodiment of the present invention.
Figure 8:
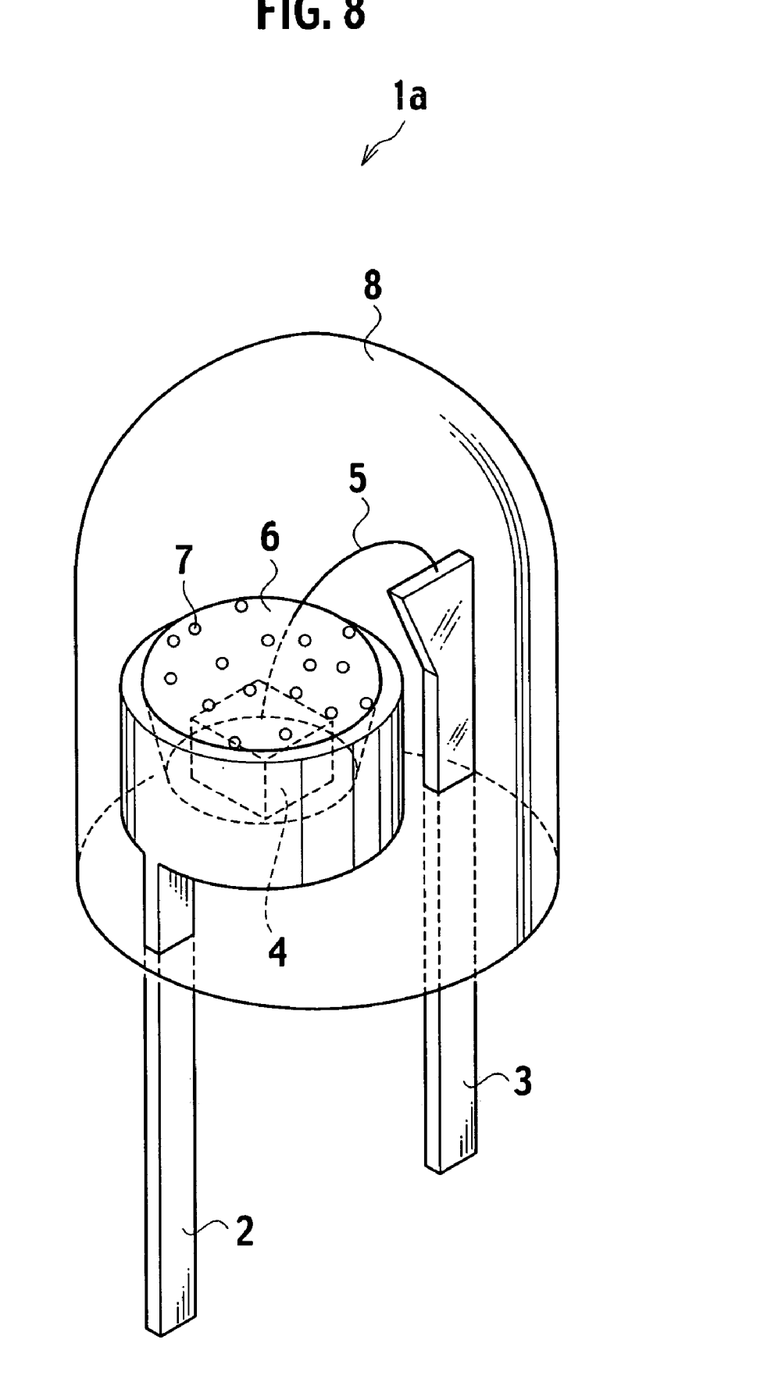
FIG. 8 is a perspective view of the white light emitting diode lamp illustrated in FIG. 7.

FIG. 7 is a cross-sectional view of a light emitting diode lamp 1a according to a first embodiment (embodiment 1) of the present invention. FIG. 8 is a perspective view of the light emitting diode lamp 1a illustrated in FIG. 7.

The light emitting diode lamp 1a is formed into a tubular shape with a round end at its top, in other words, a shape resembling an artillery shell. The light emitting diode lamp 1a includes lead wires 2, 3, a light emitting diode chip (blue light emitting diode chip) 4, a bonding wire 5, a phosphor (wavelength conversion material) 7, a first resin 6, and a second resin 8. The lower portion of the lead wires 2, 3 is exposed out of the second resin 8.

At the upper end of the lead wire 2, there is provided a cup in which a light emitting diode chip 4 (light emitting element) is placed. The light emitting diode chip 4 is electrically connected with the lead wire 2 by die bonding or the like using electrically conductive paste. The light emitting diode chip 4 is also electrically connected with the lead wire 3 by wire bonding or the like using the bonding wire 5.

In addition, the vicinities of the light emitting diode chip 4, including the recess of the above-stated cup, are sealed with the first resin 6 into which the phosphor 7 is dispersed.

Furthermore, the lead wires 2, 3, the light emitting diode chip 4, the bonding wire 5, and the first resin 6 are sealed with the second resin 8.

Next, a manufacturing procedure will be described about the light emitting diode lamp 1a.

In a first process, the light emitting diode chip 4 is die-bonded in the cup at the tip of the lead wire 2 with electrically conductive paste.

In a second process, the light emitting diode chip 4 is wire-bonded to the lead wire 3 with the bonding wire 5.

In a third process, the first resin 6 dispersed adequately with the SiAlON phosphor 7 is pre-deposited onto the element-accommodating cup to coat the light emitting diode chip 4 and then cured.

In a fourth process, the second resin 8 is deposited to enfold the lead wires 2, 3, the light emitting diode chip 4 and the first resin 6 and then cured. The fourth process is ordinarily carried out by casting.

In the meanwhile, the lead wires 2, 3 can be made as an integral member in which both of the wires are connected at their ends. When using such lead wires, a fifth process has to be adopted after the fourth process, wherein the connecting portion between the lead wires is removed to separate the lead wires 2, 3 into an individual member.

Embodiment 2

Figure 9:
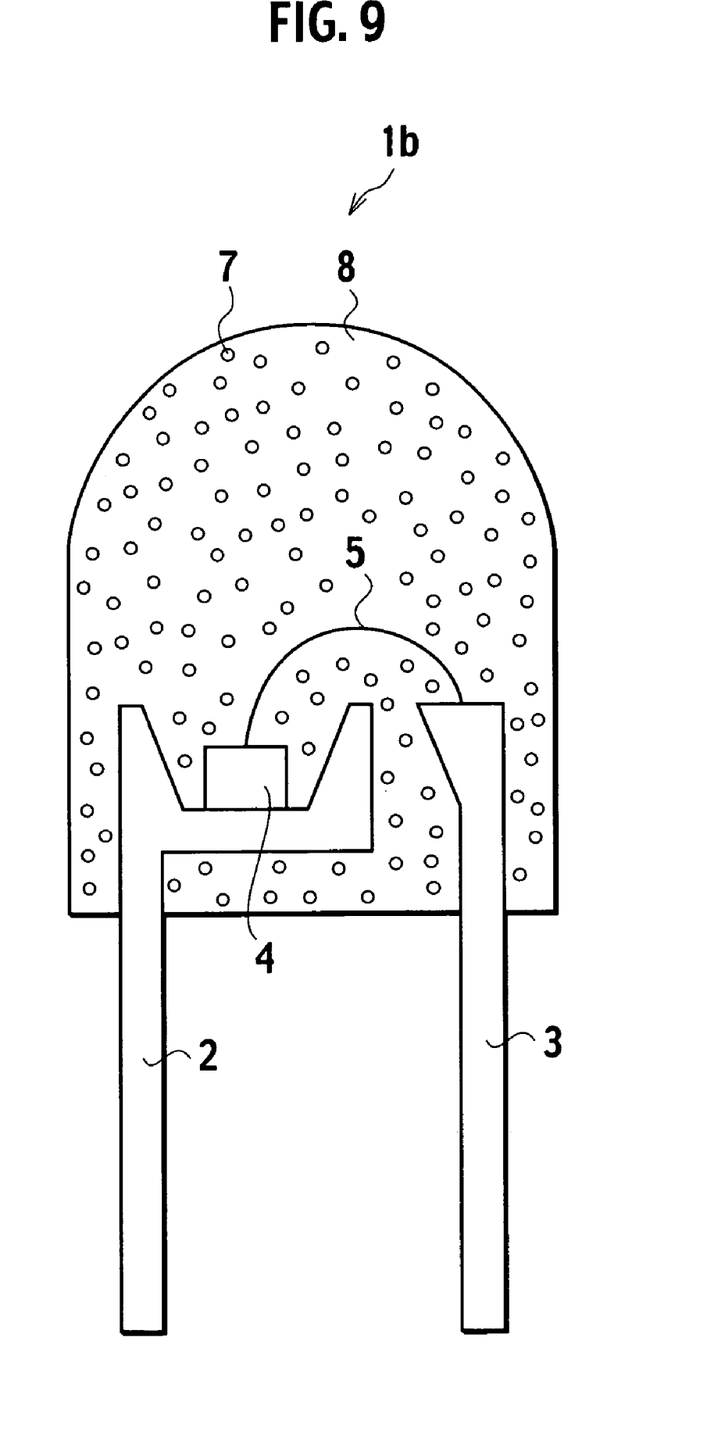
FIG. 9 is a cross-sectional view of a white light emitting diode lamp 1b according to a second embodiment.
Figure 10:
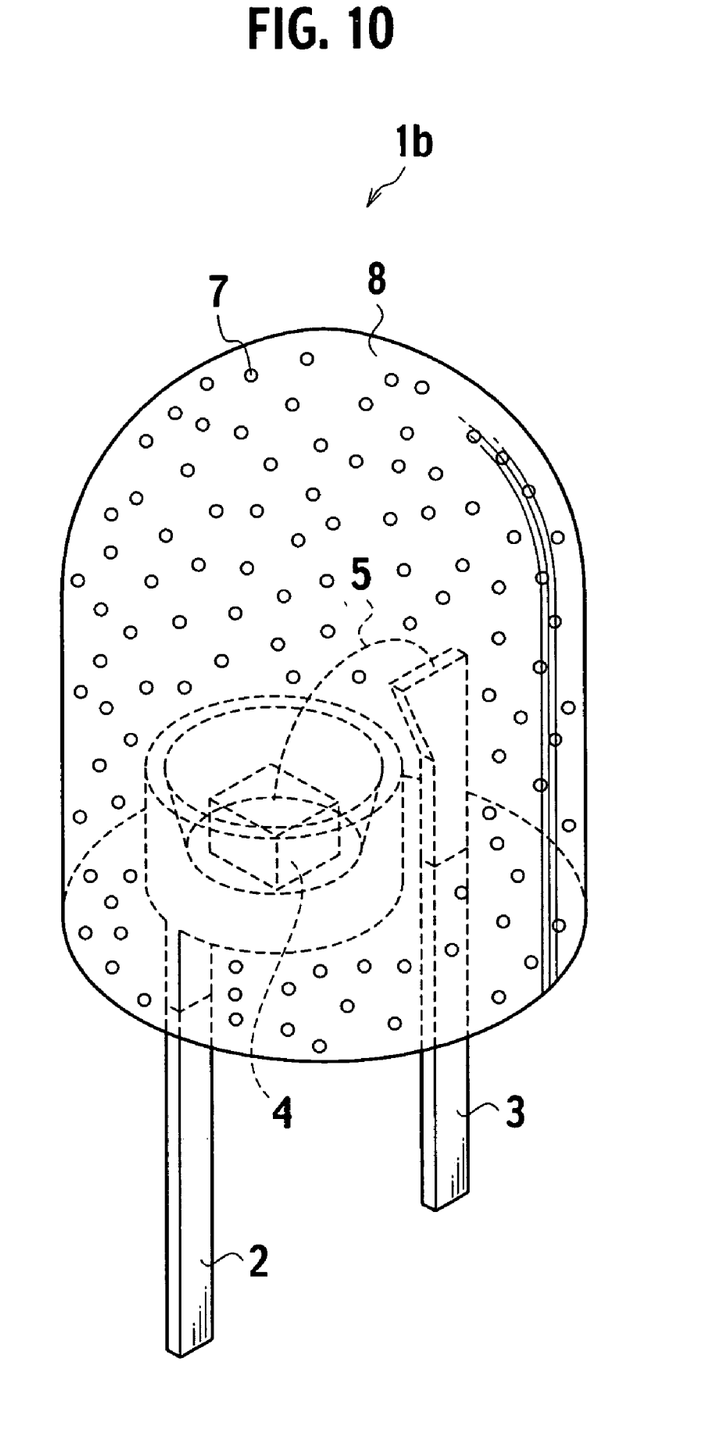
FIG. 10 is a perspective view of the white light emitting diode lamp 1b illustrated in FIG. 9.

Referring to FIGS. 9 and 10, a white light emitting diode lamp according to a second embodiment (embodiment 2) will be described hereinafter. FIGS. 9 and 10 are respectively a cross-sectional and a perspective view of the white light emitting diode lamp 1b according to the second embodiment.

Although, in the light emitting diode lamp 1a shown in FIGS. 7 and 8, the SiAlON phosphor 7 is dispersed in the vicinities of the light emitting diode chip 4, in other words, in the first resin 6, the white light emitting device lamp according to the present invention is not limited to this structure. The SiAlON phosphor 7 can be dispersed in the second resin 8 as illustrated in the second embodiment.

In fabricating the white light emitting diode lamp 1b, whereas the first resin 6 is not pre-deposited, the second resin 8 dispersed with the phosphor is deposited and cured.

An operational effect exerted by the white light emitting diode lamp 1b is the same as that by the white light emitting diode lamp 1a.

By the way, the blue light emitting diode chip 4 can emit light in a wavelength range of from 400 nm to 480 nm.

In addition, in case of a white light emitting diode lamp of ultraviolet excitation type, the lamp can be comprised of a ultraviolet light emitting diode chip and a mixture of two to five kinds of powder phosphors, one of which is the SiAlON phosphor (for example, the sample #3) according to the present invention.

When using a blue light emitting diode chip having a center wavelength of 460 nm in its emission spectrum and a SiAlON phosphor of the sample #3, there can be fabricated a white light emitting diode lamp which emits light having a low color temperature and allows anyone to readily recognize a warm nuance when he or she sees the diode emit white light. In addition, the emission intensity thereof is greater than that of a white light emitting diode lamp using a conventional alpha-SiAlON phosphor.

Embodiment 3

Figure 11:
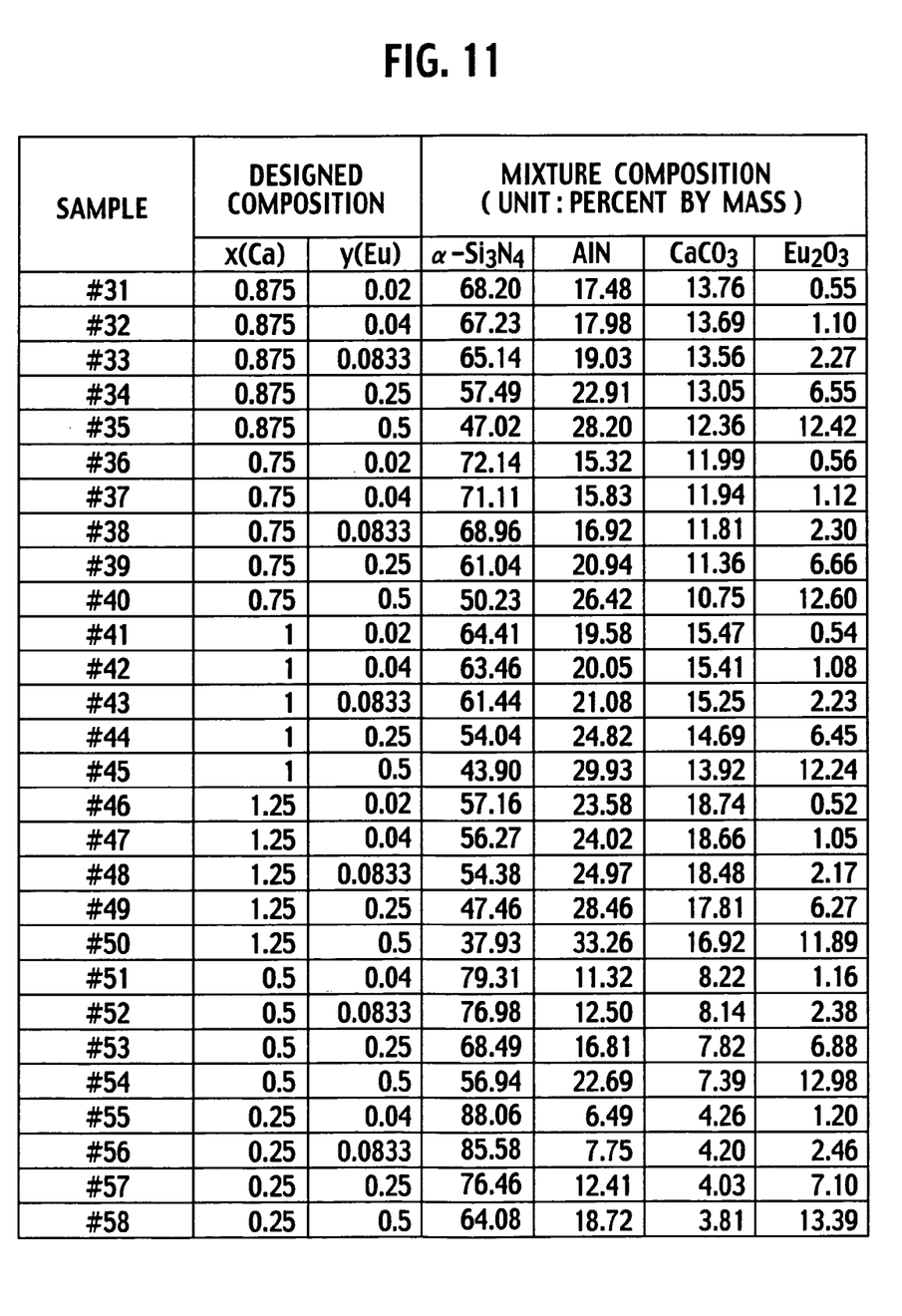
FIG. 11 is a table listing compositions of each Eu-activated Ca-alpha-SiAlON sample used in the second experiment.

A second experiment that has led the inventors to the present invention will be described hereinafter. In this experiment, twenty-eight samples each having a different composition listed in FIG. 11 are synthesized by a different synthesis method than that in the first experiment. The optical characteristics of these samples have been evaluated.

FIG. 11 summarizes designed compositions of each sample used in the second experiment and mixture compositions of each source material calculated in accordance with the designed compositions. As apparent when compared with the sample listed in FIG. 1, twenty-three out of 28 samples have the same compositions as those in FIG. 1.

The same starting materials as in the first experiment were prepared and weighed so as to obtain the designed compositions of x and y listed in FIG. 11. Next, a predetermined amount of n-hexane was added to the weighed materials and then the n-hexane-added materials were well mixed by a planetary ball mill for 2 hours.

The mixed materials were desiccated by a rotary evaporator and then pounded well in a mortar. Next, the pounded materials were granulated using a stainless steel test sieve having an aperture size of 125 micrometers to obtain powdered materials having a corresponding grain diameter, which were then charged into a covered container made of Boron Nitride.

Next, a sintering process was carried out for the powder materials in the covered container at a temperature of 1,700 degrees Celsius in a 1 MPa Nitrogen atmosphere for about 8 hours. The temperature and the pressure were much higher than those in the first experiment. Since the powder materials were solidified into a mass after the sintering, the mass was then crushed in order to obtain a powder phosphor sample. The mass after the sintering was easily crushed into powder with an application of only a little force.

Then, the excitation and emission spectra of the 28 powder phosphor samples were measured. The measurement was carried out by a fluorescence spectrophotometer, which spectral distribution was corrected using Rhodamine B and a standard light source.

Figure 12:
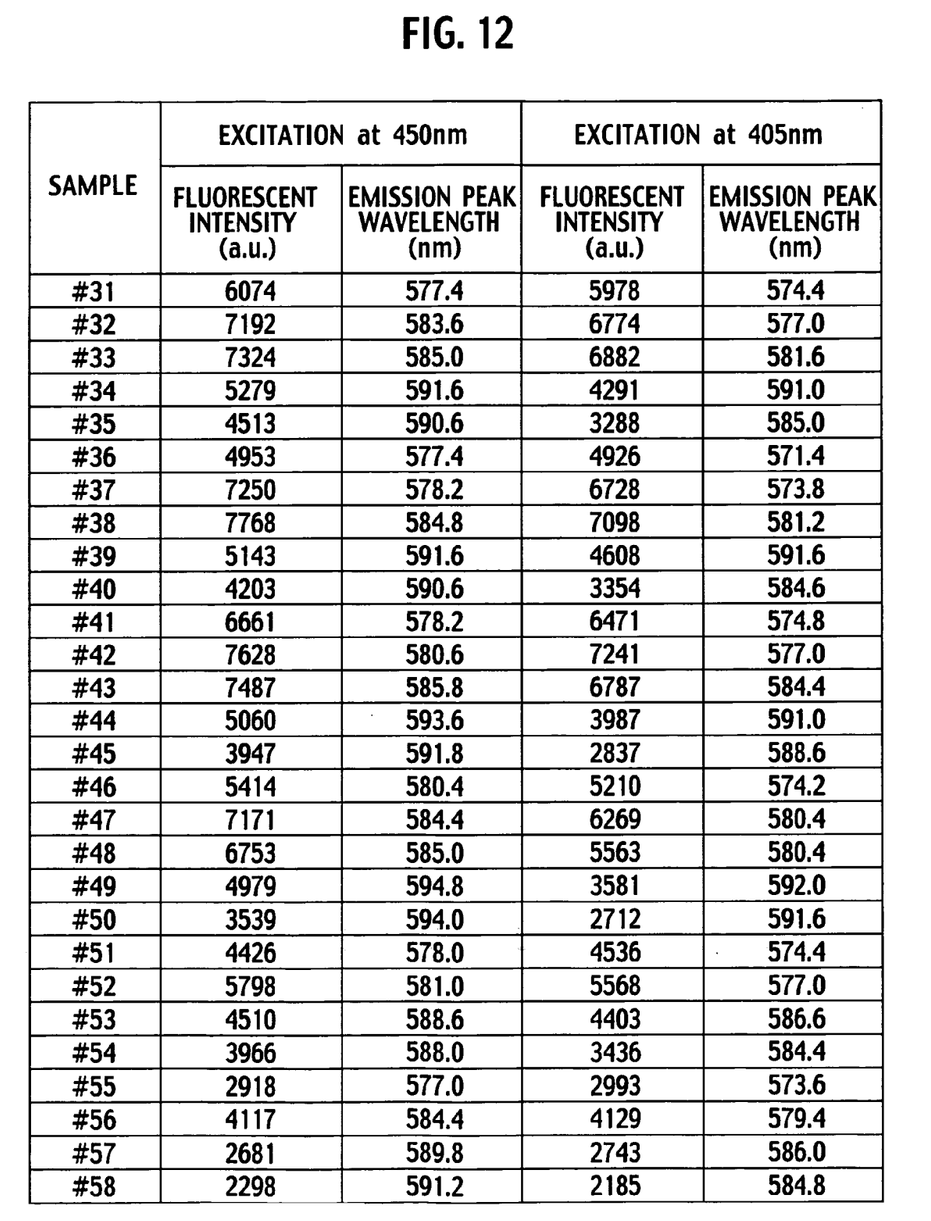
FIG. 12 is a table listing fluorescent intensities and emission peak wavelengths of each sample listed in FIG. 11.

FIG. 12 summarizes fluorescent intensities and emission peak wavelengths obtained from the measurement with excitation wavelengths of 450 nm and 405 nm, respectively. The excitation wavelength of 450 nm was employed on the assumption that the phosphor samples in this embodiment are applied to a white light emitting diode lamp of blue excitation type, which now stays in a mainstream, whereas the excitation wavelength of 405 nm was employed on the assumption that the samples are applied to a white light emitting diode lamp of near-ultraviolet excitation type, which is prospected to come into a wide use. By the way, a white light emitting diode lamp of 405 nm excitation type is also referred to as near-ultraviolet excitation type or purplish-blue excitation type.

First, the fluorescent intensity obtained from the measurement with the excitation wavelength of 450 nm in FIG. 12 will be described. The samples #38, #42, #43, #33, #37, #32, and #47 have extremely high fluorescent intensities, while the samples #48, #41, #52, #34, #39 and #44 have sufficiently high fluorescent intensities. From the results, it is found that excellent characteristics have been obtained from a sample having a value of x from 0.75 to 1.0 and a value of y from 0.04 to 0.25. These results are substantially the same as those in the first experiment.

Moreover, when a value of x is in a range of from 0.75 to 1.0 ($0.75 \leq x \leq 1.0$) and a value of y is in a range of from 0.04 to 0.0833 ($0.04 \leq y \leq 0.0833$), the SiAlON phosphor has more excellent characteristics.

By the way, the samples #47 and #48 having a value of x=1.25 have an increased fluorescent intensity in the second experiment, on contrary to the result in the first experiment. This is because the phosphor quality may be improved by increasing the sintering temperature and the nitrogen pressure. In other words, a phosphor having a large value of x is not easily sintered and thereby a higher temperature and pressure probably be required compared with a sample having a relatively small value of x. To determine the production conditions, a lower sinter temperature and a lower nitrogen pressure are preferable in terms of fabrication costs and also a prevention of quality degradation caused by deviations in production conditions. From the above considerations, it can be concluded that a phosphor having a value of x from 0.75 to 1.0 and a value of y from 0.04 to 0.25 is preferable. In addition, it is more preferable when the phosphor has a value of x from 0.75 to 1.0 and a value of y from 0.04 to 0.0833.

Next, fluorescent intensity measured with an excitation wavelength of 405 nm will be explained. Particularly high fluorescent intensities are obtained from the samples #42, #38, #33, #43, #32, and #37, followed by the samples #41, #47, #31, #52, #48 and #46. In addition, the samples #36, #39, #51, #53, #34, #56, and #44 have sufficient fluorescent intensities. Therefore, it has been confirmed that the phosphor samples having a composition of $0 \leq x \leq 1.0$ and $0.04 \leq y \leq 0.25$ have excellent characteristics and specifically the samples having a composition of $0.75 \leq x \leq 1.0$ and $0.04 \leq y \leq 0.0833$ have especially excellent characteristics.

Embodiment 4

Figure 13:
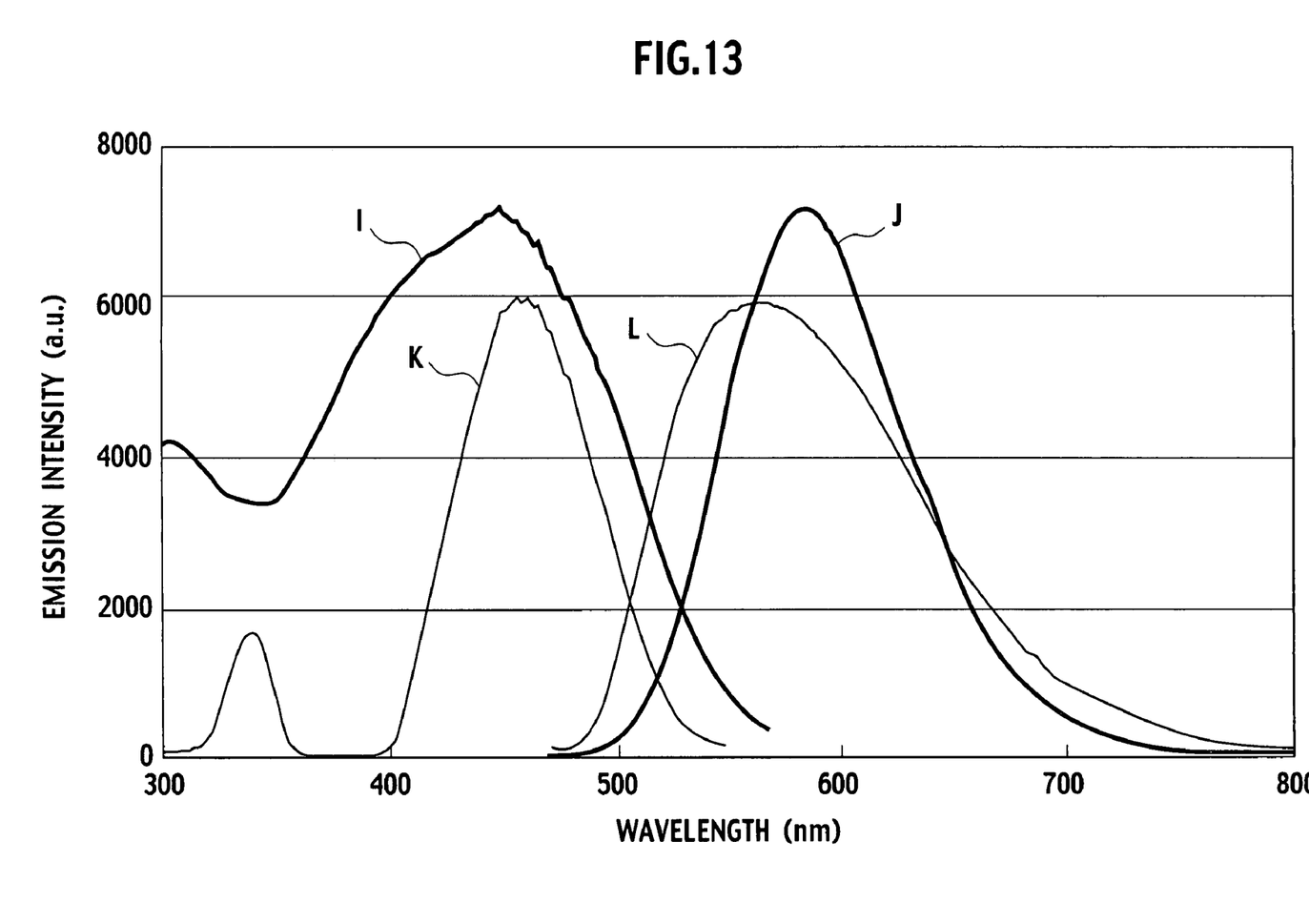
FIG. 13 illustrates excitation and emission spectra of a phosphor sample according to a fourth embodiment and a commercially available yttrium-aluminum-garnet phosphor.

Another embodiment of the oxynitride phosphor according to the present invention will be described with a comparison of a commercially available yttrium-aluminum-garnet phosphor. FIG. 13 illustrates the excitation and emission spectra of the phosphor sample according to this embodiment (denoted as FY6 hereinafter) and a commercially available yttrium-aluminum-garnet phosphor.

The sample FY6 has a composition x and y of 0.875 and 0.07, respectively. Thus, a mixture composition of starting materials for FY6 was 65.14 wt % of alpha-$Si_3N_4$, 19.03 wt % of AlN, 13.56 wt % of $CaCO_3$, and 2.27 wt % of $Eu_2O_3$. When preparing the sample FY6, sintering process was carried out at a temperature of 1,700 degrees Celsius under nitrogen atmosphere of 0.5 MPa for 50 hours. After sintering, the sintered materials were classified using a stainless steel test sieve having an aperture size of 45 micrometers to obtain powdered materials having a grain diameter of 45 micrometers or smaller. Except the above conditions, the sample was prepared in accordance with the procedures described in the embodiment 3. A phosphor for comparison has a composition represented generally by $(Y,Gd)_3Al_5O_{12}:Ce^{3+}$.

An emission spectrum of the sample FY6 was measured using an excitation light having a wavelength of 450 nm. Also, an excitation spectrum of the sample FY6 was measured using an emission monitoring wavelength of 585 nm. On the other hand, regarding a commercially available yttrium-aluminum-garnet phosphor, an excitation spectrum was measured with an excitation wavelength of 460 nm and an emission spectrum was measured with an emission monitoring wavelength of 568 nm. The measurements were carried out by a fluorescence spectrophotometer, which spectral distribution was corrected using Rhodamine B and a standard light source.

In FIG. 13, lines I and J represent the excitation and emission spectra of the sample FY6, respectively, whereas lines K and L represent the excitation and emission spectra of the yttrium-aluminum-garnet, respectively. As shown in FIG. 13, the sample FY6 has a far higher fluorescent intensity compared with the yttrium-aluminum-garnet. In addition, in the excitation spectra, the sample FY6 has a higher excitation intensity and a very wide width covering an ultraviolet to blue region of the spectrum compared with the commercially available yttrium-aluminum-garnet. From these results, it is concluded that the oxynitride phosphor according to the present invention is an excellent phosphor. By the way, the CIE1931 chromaticity coordinates (x, y) obtained from the emission spectrum of the sample FY6 are (0.52, 0.48).

Embodiment 5

Next, an emission spectrum of a light emitting diode lamp according to an embodiment 5 of a light emitting device of the present invention will be explained with a comparison of that of a commercially available light emitting diode lamp.

The light emitting diode lamp according to the embodiment 5 is a light emitting diode lamp of artillery shell type as shown in FIGS. 7 and 8. As a phosphor 7 is used the sample FY6 stated above in the embodiment 4. In addition, as a blue light emitting diode chip 4 is used an InGaN blue light emitting diode chip fabricated on a SiC substrate. The emission peak wavelength of the InGaN blue light emitting diode chip is measured to be about 454 nm.

The light emitting diode lamp according to the embodiment 5 has a luminous efficacy of 36.3 lm/W, a color temperature of 2780 K, and CIE1931 chromaticity coordinates (x, y) of (0.46, 0.41). From these measurements, the light emitting diode lamp has a chromaticity corresponding to the incandescent lamp color which is defined along with the daylight color, the daylight-white color, the cool-white color, and the warm-white color in Japanese Industrial Standard (JIS) Z 9112-1990 "Classification of fluorescent lamps by chromaticity and color rendering property". Then, for comparison purpose, a light emitting diode lamp having a chromaticity of an incandescent lamp color is chosen from various types of commercially available light emitting diode lamps of artillery shell type. This commercially available light emitting diode lamp for comparison has a luminous efficacy of 22.5 lm/W, a color temperature of 2,800 K, and CIE1931 chromaticity coordinates (x, y) of (0.46, 0.41).

Figure 14:
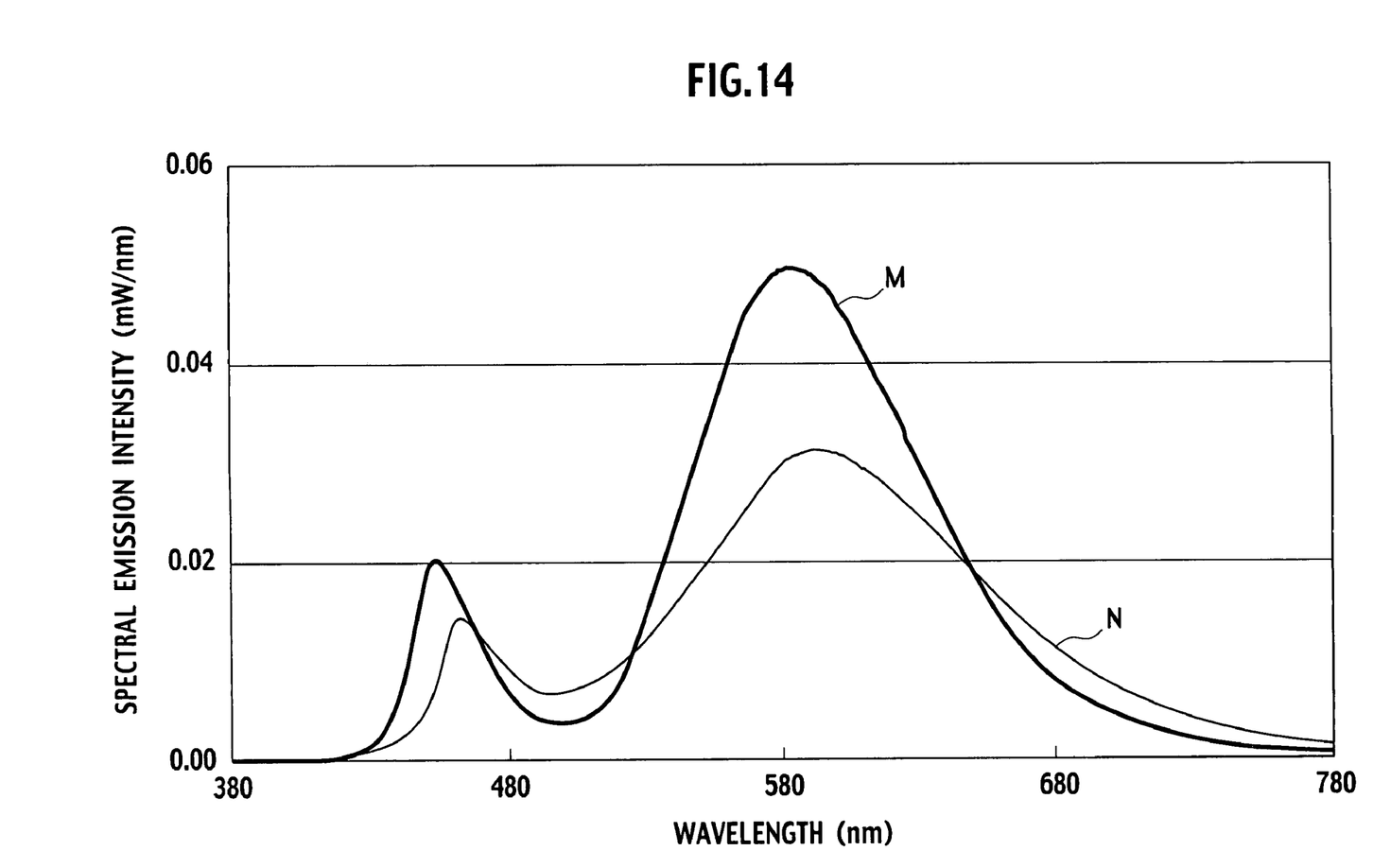
FIG. 14 illustrates emission spectra of a light emitting diode lamp according to a fifth embodiment and a commercially available light emitting diode lamp for comparison.

FIG. 14 illustrates the comparison result, in which lines M and N are emission spectra of the light emitting diode lamp according to the embodiment 5 and the commercially available light emitting diode lamp, respectively. As shown in FIG. 14, the light emitting diode lamp according to the embodiment 5 has a higher emission intensity compared with the commercially available light emitting diode lamp. In addition, the luminous efficacy of the light emitting diode lamp according to the embodiment 5 is 1.6 times as high as the commercially available one.

Referring to several embodiments above, an oxynitride phosphor and a light emitting device according to the present invention have been described. However, the present invention is not limited to the embodiments and various modifications thereof are possible. For example, whereas the first and second embodiments have described in detail the light emitting diode chip 4 having one electrode on an upper side (i.e., on the side to be connected with the bonding wire 5) and the other on a lower side (i.e., on the side to contact with the element-accommodating cup), a light emitting diode chip having two electrodes on the upper side and none on the lower side can be used.

In this case, as far as the light emitting diode chip is fixed on the lead wire, an electrically conductive paste is not necessarily required in the first process. Instead, two bonding wires are used for bonding in the second process.

In addition, the shape of lead wires is not limited to that illustrated here as far as the light emitting diode chip can be placed thereon.

Although the present invention has been described in conjunction with the foregoing specific embodiments, many alternatives, variations and modifications will be apparent to those of ordinary skill in the art. Those alternatives, variations and modifications are intended to fall within the spirit and scope of the appended claims.

What is claimed is:

1. An oxynitride phosphor represented by a general formula $Ca_xSi_{12-(m+n)}Al_{(m+n)}O_nN_{16-n}:Eu^{2+}_y$;
    wherein a calcium composition of x is in a range of from 0.75 to 1.0 and a europium composition of y is in a range of from 0.04 to 0.0833,
    wherein an oxygen composition of n is greater than 0.81, and
    wherein a main phase thereof has substantially an alpha SiAlON crystal structure.

2. A light emitting device comprising:
    a semiconductor light source element, and
    a wavelength conversion material that converts a wavelength of light emitted from said semiconductor light source element,
    wherein the wavelength conversion material is represented by a general formula $Ca_xSi_{12-(m+n)}Al_{(m+n)}O_nN_{16-n}:Eu^{2+}_y$, in which a calcium composition of x is in a range of from 0.75 to 1.0 and a europium composition of y is in a range of from 0.04 to 0.0833, in which the oxygen composition of n is greater than 0.81 and in which a main phase thereof has substantially an alpha SiAlON crystal structure.

3. A light emitting device according to claim 2, wherein the semiconductor light source element is a semiconductor light emitting diode that has a primary emission wavelength of from 400 nm to 480 nm.

* * * * *